United States Patent
Ng

Patent Number: 5,994,217
Date of Patent: Nov. 30, 1999

[54] POST METALLIZATION STRESS RELIEF ANNEALING HEAT TREATMENT FOR ARC TIN OVER ALUMINUM LAYERS

[75] Inventor: Yat Meng Ng, Singapore, Singapore

[73] Assignee: Chartered Semiconductor Manufacturing Ltd., Singapore, Singapore

[21] Appl. No.: 08/767,010

[22] Filed: Dec. 16, 1996

[51] Int. Cl.$^6$ .................................................. H01L 21/477
[52] U.S. Cl. ..................... 438/636; 438/648; 438/656; 438/660; 438/688
[58] Field of Search ................................. 438/660, 688, 438/636, 656, 642, 648

[56] References Cited

U.S. PATENT DOCUMENTS

| | | | |
|---|---|---|---|
| 5,017,508 | 5/1991 | Dodt et al. | 437/173 |
| 5,298,436 | 3/1994 | Radoserich et al. | 437/29 |
| 5,488,009 | 1/1996 | Hsue et al. | 438/52 |
| 5,641,922 | 6/1997 | Lee et al. | 257/762 |
| 5,677,238 | 10/1997 | Gn et al. | 438/194 |
| 5,700,718 | 12/1997 | McTeer | 438/192 |
| 5,723,367 | 3/1998 | Wada et al. | 438/248 |
| 5,739,046 | 4/1998 | Lur et al. | 438/190 |
| 5,759,916 | 6/1998 | Hsu et al. | 438/636 |
| 5,798,301 | 8/1998 | Lee et al. | 438/653 |
| 5,877,087 | 3/1999 | Mosely et al. | 438/656 |
| 5,926,736 | 7/1990 | DeSilva | 438/637 |

Primary Examiner—Wael Fahmy
Assistant Examiner—Kurt Eaton
Attorney, Agent, or Firm—George O. Saile; Rosemary L.S. Pike; William J. Stoffel

[57] ABSTRACT

An heat treatment (anneal) process is provided that reduces stress in a metal layer structure having ARC TiN layer overlaying an aluminum layer formed in a high temperature process. An metal layer 32 composed of Al/Cu/Si is sputtered at a temperature of about 505° C. on a semiconductor structure 10. Next, an ARC TiN layer 34 is deposited over the metal layer 32. In an important process, a heat treatment (anneal) is performed on the metal layer 32 and the ARC TiN layer 34. The heat treatment comprises three steps. First, a ramp up step is performed wherein the temperature is increased from room temperature to a temperature of about 450° C. at a rate of about 40° C./sec. Second, a temperature hold step is performed where the temperature is held at about 450° C. for a time of about 30 seconds. Third, a ramp down step is performed where the temperature is ramped down at rate in a range of between about 8 and 10° C./sec to room temperature. The heat treatment anneal of the present invention reduces the stress between the ARC TiN and Al layers which eliminates any peeling and blemishing of the ARC TiN layer.

10 Claims, 3 Drawing Sheets

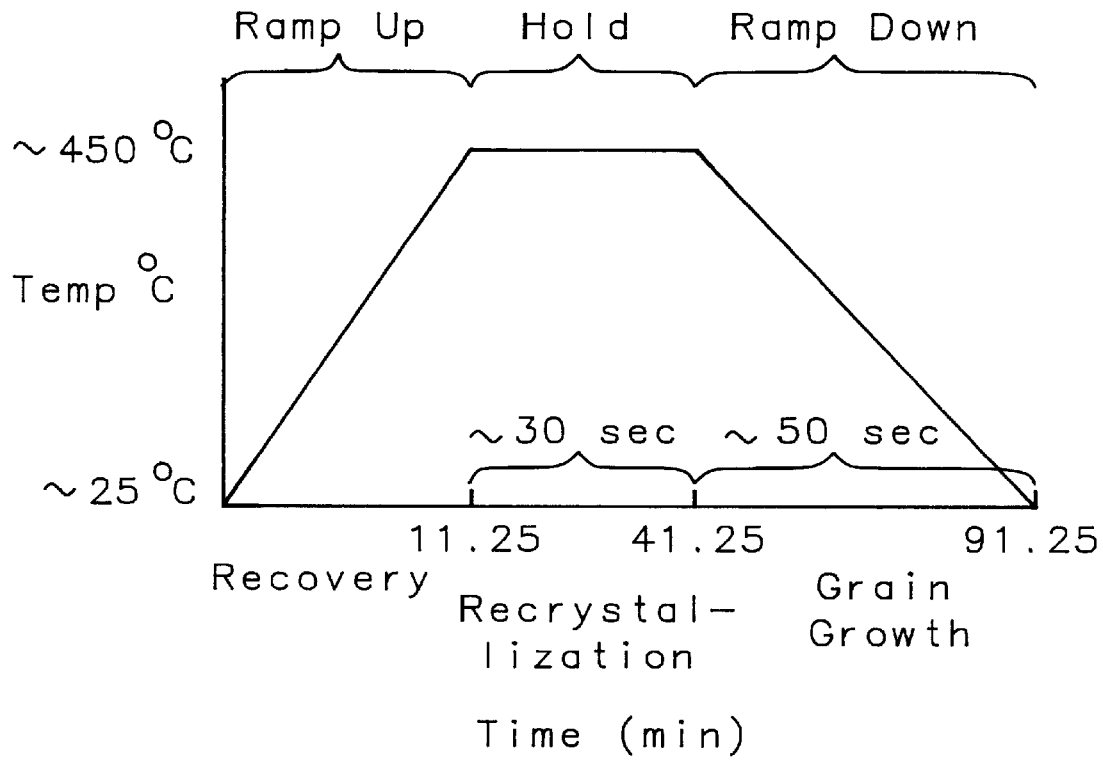
FIG. 3
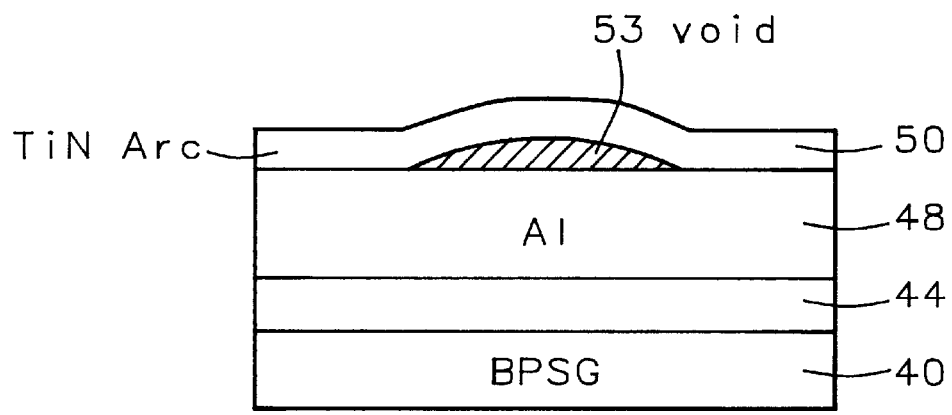
FIG. 4 - Prior Art

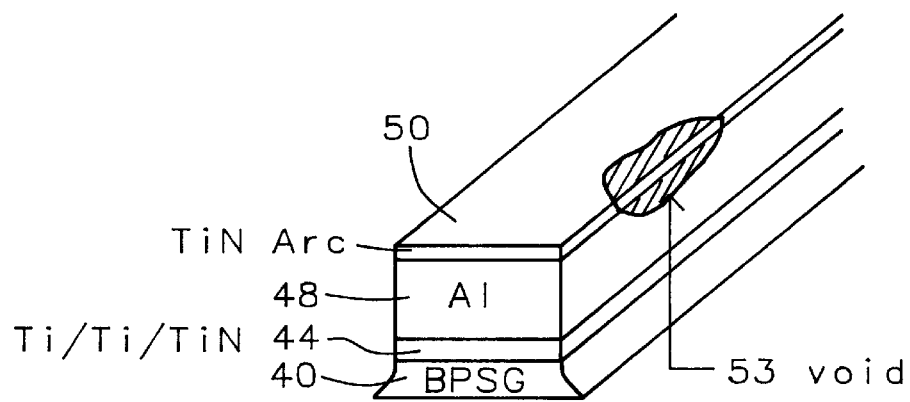
FIG. 5 – Prior Art
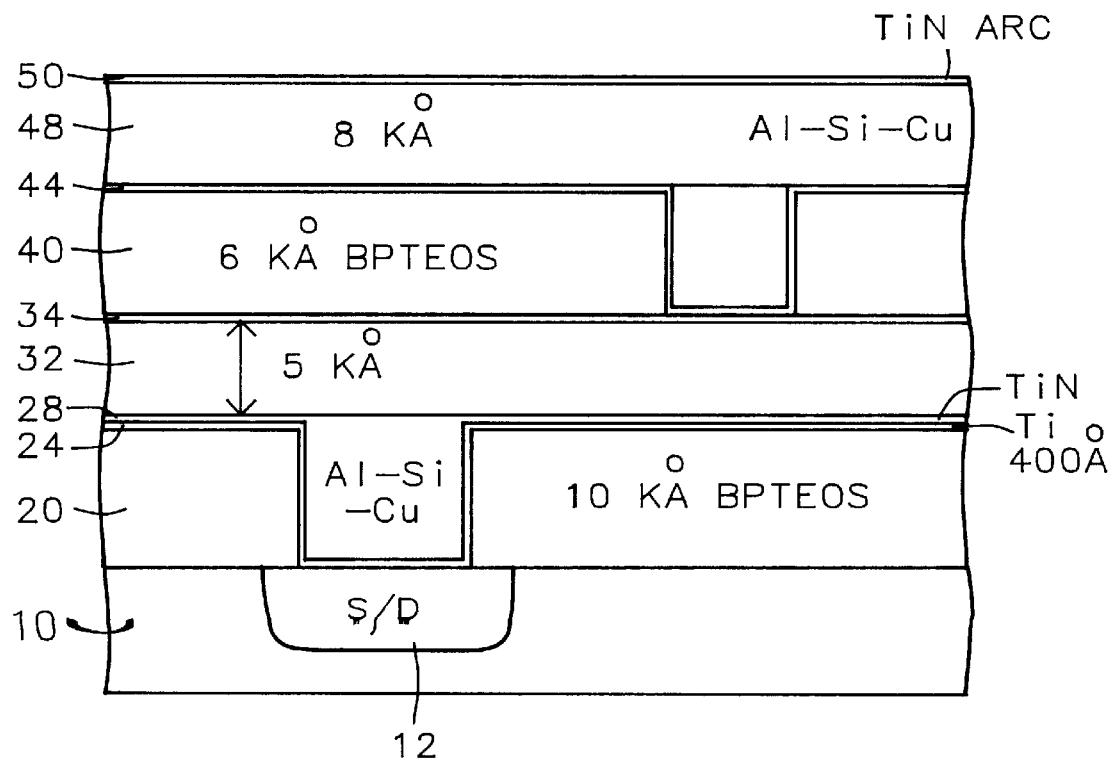
FIG. 6

POST METALLIZATION STRESS RELIEF ANNEALING HEAT TREATMENT FOR ARC TIN OVER ALUMINUM LAYERS

BACKGROUND OF INVENTION

1) Field of the Invention

This invention relates generally to the fabrication of metal layers and interconnects for semiconductor devices and more particularly to a heat treatment for interconnects comprising a titanium nitride Anti-Reflection Coating (ARC) layer over an aluminum layer.

2) Description of the Prior Art

Metal layers and interconnects are important technologies in semiconductor manufacturing. Interconnects electrically connect together different conductive wiring layers in a semiconductor chip. The conductive layers can be layers formed on a substrate surface, such as source/drain contacts or gate structures, or overlying metal wiring layers. It is important that these interconnects, vias, and conductive wiring layers be reliable, be as small as possible to miniaturize the circuit and have wide process windows for high yields.

Often metal layers are formed having overlying anti-reflective coating (ACR layers. These anti-reflective coating layers (such as titanium nitride anti-reflective coating (TiN ACR) layers improve photolithographic processes by providing a dull surface overlying the reflective metal lines.

In addition to the overlying ARC layers, metal layers are formed having underlying barrier layers, such as Ti:W, $TiSi_2$, TiN, etc. These layers are critical in helping the metal layers, usually aluminum, to adhere to various surfaces, such as oxides. The layers also block aluminum metal from spiking out and reacting with other surfaces, such as silicon. The combination of layers is called a metal stack (for example, a bottom TiN layer, a middle aluminum layer and a top TiN layer).

As shown in FIGS. 4 and 5, we have found that current processes for forming metal layers and interconnects have problems related to stress. FIGS. 4 and 5 show a Ti layer 44, an Al layer 48, an ARC TiN layer 50 (a metal stack) formed over an insulating layer 40. The stress can cause peeling and delamination of the metal stack. More particularly, a top Anti-Reflection Coating TiN layer 50 delaminates from an underlying aluminum layer 48 as shown in FIGS. 4 and 5. Also the stress can cause blemishes, slits, voids, silicon precipitates (nodules) and hillocks. The void/blemish problem appears to be worse on higher temperature aluminum formation processes.

Others have attempted to solve similar problems. U.S. Pat. No. 5,298,436 (Radosevich) shows varying the deposition rate to give lower stress. U.S. Pat. No. 5,017,508 (Dodt) shows the use of annealing by RTA for annealing irradiation induced damage. However, these methods can be further improved.

Therefore, there exists a need to develop processes that relieve stress in metal/TiN ARC layers that are tailored to the deposition processes used to form these layers. There exists a need for a process that eliminates the peeling and blemishing of a TiN Arc layer over an Al layer.

SUMMARY OF THE INVENTION

It is an object of the present invention to provide a method for a stress relief anneal after metal stack deposition that reduces stress in the metal stack.

It is an object of the present invention to provide a method for fabricating a blemish free Anti-Reflection—Coating (ARC) TiN layer over an sputter deposited, high temperature process, aluminum layer by relieving stress in the layers.

It is an object of the present invention to provide a method of forming a TiN/Al interconnect layer which is defect free, and simple to manufacture.

It is yet another object of the present invention to provide a post Al layer and ARC TiN layer anneal that reduces stress between the Al layer and the ARC TiN layer so that ARC TiN delamination problems are eliminated.

To accomplish the above objectives, the present invention provides a method of forming a defect free/reduced stress ARC TiN layer and Aluminum layer. The invention provides a three step anneal that reduces stress between the AL layer and the overlying ARC TiN layer. A metal layer 32 composed of AL is formed onto a semiconductor structure 10. The metal layer 32 is preferably composed of Al/Cu/Si sputtered deposited using a high temperature at a temperature in a range of between about 495 and 515° C. Next, an Anti-Reflection (ARC) Coating TiN layer 34 is deposited over the Al metal layer 32.

In the important process stage, a three step heat treatment is performed on the metal layer 32 and the ARC TiN layer 34. The heat treatment is performed in a $N_2$ atmosphere and comprises three steps. First, a ramp up step is performed wherein the temperature is increased from room temperature to a temperature between about 440° C. To 460° C. (tgt= 450° C.) at a rate in a range of between about 30 to 50° C./sec. Second, a temperature hold step is performed where the temperature is held at in a range of about 440° C. and 460° C. (tgt–450° C.) for a time in a range of between about 25 and 35 seconds. Third, a ramp down step is performed where the temperature is ramped down at rate in a range of between about 8 and 10° C./sec to room temperature. The ARC TiN and Al layers are is then patterned preferably using a reactive ion etch (RIE) process. The heat treatment anneal of the present invention reduces the stress between the ARC TiN and AL layers which eliminates any peeling and blemishing of the ARC TiN layer.

The high temperature Al sputter deposition in combination with the ARC TiN barrier layer creates stresses which cause peeling and blemishing. The heat treatment anneal (i.e., stress relief anneal process) of the present invention reduces the stresses between the Al/SI/Cu metal layer and the ARC TiN layer and eliminates peeling problems. The three steps of the heat treatment correspond to three stress relieving stages: (a) recovery (ramp up)–(b) recrystallization (temp. hold)–(c) grain grown cycle (ramp down). The recovery stage (ramp up step) is designed to produce strain relieve effect through enhanced dislocation motion (without applied external stress). The second step of recrystallization produces equaixed grains which have much less internal strain energy. The driving force for the new grains formation is the difference in internal energy between the strain and unstraint equiaxed grains so formed. The third step (ramp down) is the normal grain growth cycle. This three step anneal reduces the stress between the ARC TiN layer and the AL layer thereby eliminating the delamination problem.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 3 is a graph showing the three stage heat treatment anneal according to the present invention.

FIGS. 4 and 5 are cross sectional views illustrating the peeling form the high temperature Al deposition and the TiN layer.

FIG. 6 is a cross sectional view illustrating the metal one stack and metal two stack of the present invention.

DETAILED DESCRIPTION OF THE PREFERRED EMBODIMENTS

The present invention will be described in detail with reference to the accompanying drawings. The present invention provides a method of forming a defect free/reduced stress ARC TiN layer over a high temperature sputtered Aluminum (interconnect) layer which is characterized as follows.

A semiconductor structure 10 is provided. The semiconductor structure 10 can comprise a silicon substrate with devices (such as source and drain regions) formed in and over the substrate. The semiconductor structure 10 can also comprise insulating and conductive layers formed over a substrate and patterned layers, such as gate electrodes and word lines.

Figure 1:
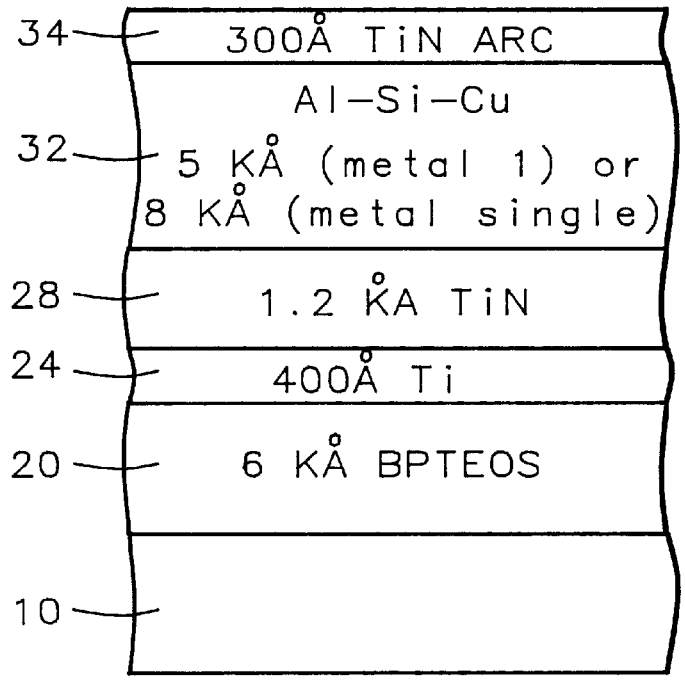
FIG. 1 is a cross sectional view for illustrating a method for manufacturing a metal one stack interconnect layer according to the present invention.

As shown in FIG. 1, a preferred embodiment of the invention is a formation of a one metal stack structure 10 20 24 28 32 34. This type structure is preferably used as the (lowest) first interconnection layer contacting the substrate. A first insulating layer 20, preferably composed of borophosphosilicate glass (BPSG), is formed over the semiconductor structure 10. The first insulating layer 20 is preferably formed using a BPTEOS oxide process and preferably has a thickness in a range of about 4000 and 6000 Å and more preferably about 5,500 Å.

Next, a titanium layer 24 is formed over the first insulating layer 20. The titanium layer 24 preferably has a thickness in a range of between about 350 and 450 Å and more preferably about 400 Å. The Ti layer is preferably sputter deposited.

A titanium nitride (TiN) barrier layer 28 is then deposited over the titanium layer 24. The TiN barrier layer preferably has a thickness in a range of between about 1100 and 1300 Å and more preferably about 1200 Å. The TiN barrier layer prevent junction spiking (Al diffusing into the Silicon).

Next, a metal layer 32 composed of aluminum is formed over the semiconductor structure. The metal layer 32 is preferably composed of Al/Cu/Si and is sputtered preferably at a temperature in a range of between about 490 and 520° C. and more preferably in a range of between about 495 and 515° C. and most preferably at about 505° C. The high sputter temperature is contributes to the high metal line stress. The high temperature Al deposition contributes to most to the changes in the film structure that will eventually manifest itself as stress.

The aluminum metal layer preferably has a composition of a Si wt % in a range of about 0.75 and 0.85 and a Cu wt % in a range of about 0.45 and 0.55 and more preferably about 0.8 wt % Si—0.5 wt % Cu—98.7%Al.

The aluminum alloy layer 32 is preferably deposited in a sputter by bombarding a metal ingot with plasma. Other metal deposition processes are also suitable. The metal target can be an aluminum ingot comprising about 0.75 to 0.85% Silicon and 0.45 to 0.55% cu and the balance of 99.999995% purity aluminum. The aluminum which is vaporized by the plasma is deposited on the semiconductor surface. The aluminum alloy layer can be sputter deposited from a single target containing Al, Cu and silicon, at an energy of between about 9.5 and 10.0 kW, at a wafer temperature of between about 440 and 500° C., in a gas ambient of Argon and at a pressure of between about 1E-3 and 3E-3 torr (tgt=2E-3 torr), at a voltage in a range between about 480 and 650 V and a DC power supply. The Al metal is sputtered at a rate in a range of between about 11,400 and 12,600 Å/min (12,000 Å/min+/−5%) and more preferably about 12,000 Å/min. The sputter tool can be a model Endura 5500 made by Applied Materials, USA.

Next, an Anti-Reflection Coating (ARC) TiN layer 34 is deposited over the metal layer 32. As shown in FIGS. 4 and 5, the blemish problem (void 53) is caused by delamination of the ARC TIN layer overlying the Al—Si—Cu layer. The blemish appears when viewed though by an optical scope.

An anti-reflecting—coating (ARC) TiN layer 34 is formed over the metal lines. The anti-reflective properties improve lithography resolution by reducing reflectance off the layer. The ARC TiN layer can be formed by a sputtering process by reacting an excess of $N_2$ with Ti metal target. The layer 34 preferably has a reflectivity in a range between 0.5 and 0.6 and more preferably about 0.55.

In an important stage, the three step heat treatment anneal of the present invention is performed on the metal layer 32 and the ARC TiN layer 34. As shown in FIG. 3, the heat treatment comprises three steps. The three steps of the heat treatment correspond to three stress relieving stages: (a) recovery (ramp up)–(b) recrystallization (temp. hold)–(c) grain grown cycle (ramp down). The heat treatment is a preferably performed in $N_2$ or $Ar_2$ gasses and more preferably in a $N_2$ ambient.

First, a ramp up step is performed wherein the temperature is increased from room temperature to a temperature in a range between about 440° C. To 460° C. (tgt–450° C.) at a rate in a range of about 40 and 50° C./min and more preferably a rate of about 45° C./min. The ramp rate is critical to causing recovery. Recovery describes the producing of strain relieves effect through enhanced dislocation motion in the film.

Second, a hold step is performed where the temperature is held at in a range of about 440° C. and 460° C. (tgt–450° C.) for a time in a range of about 30 and 40 sec. The holding temperature and time are critical to causing recrystallization.

Third, a ramp down step is performed where the temperature is ramped down at a rate in a range of about 30 and 40° C./sec to room temperature.

This anneal is specially tailored to solve the blemish problem on Al and TiN layers. The heat treatment will also work on any Al and ARC TiN layers of any composition formed by any process that have the blemish/delamination stress problem.

After the heat treatment of the present invention, the metal layer and TiN layer are patterned using photo-etch processes. A metal photoresist layer having a pattern is formed over the metal stack 24 18 32 34. Next, the metal layer 28 32 34 is etched using a chlorine containing gas such as $Cl_2$ or $BCl_3$ and combinations thereof.

FIGS. 4 and 5 show the TiN peeling and void problem that occurs if the heat treatment of the invention is not performed after the "hot" Al sputter process. These voids are eliminated with the heat treatment anneal of the invention.

Next the photoresist is striped, preferably in an $O_2$ or $H_2O$ stripper. The discoloration problem which appears when not using the heat treatment of the present invention is observable at this point. See FIG. 5.

Figure 2:
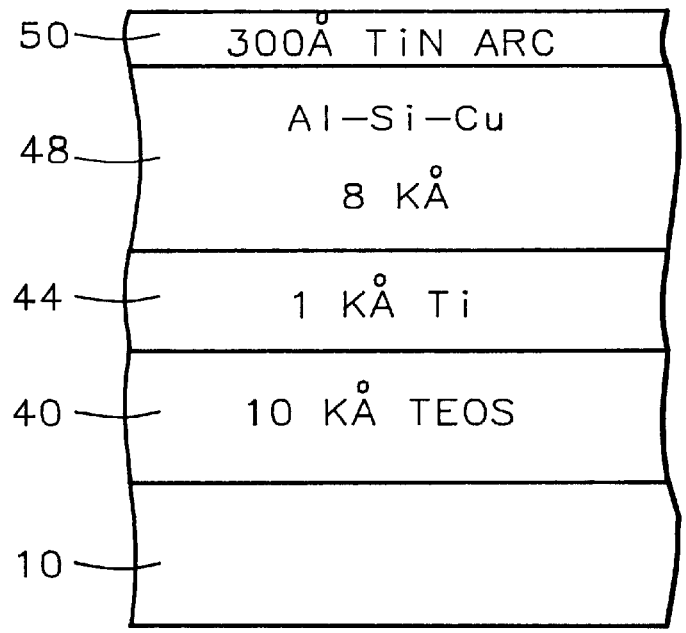
FIG. 2 is a cross sectional view for illustrating a method for manufacturing a metal two stack interconnect layer according to the present invention.

Below is a process description for forming a second metal layer (a metal two stack) as shown in FIG. 2. The second metal layer is preferably formed over the first metal layer. Also see FIG. 6.

Both the one metal stack and two metal stack have the same blemishing and void problem which involves the Al—Si—Cu layer 32 48 and the (top) TiN Arc layer 34 50.

The method to form the metal two stack structure shown in FIG. 2 is similar to the method described above for the Metal one stack. The metal two stack structure does not have the TiN layer 28 (see FIG. 1) and has different thicknesses for the other layers.

Referring to FIG. 2, a BPTEOS oxide layer 20 is formed over the substrate surface 10. A second insulating layer 40 composed of BPSG is formed over the semiconductor structure 10. The second insulating layer 40 is preferably formed using a BPTEOS oxide process and preferably has a thickness in a range of about 9000 and 11000 and more preferably about 10,000 Å.

Next, a titanium (Ti) layer 44 is formed over the second insulating layer 40. The titanium layer 44 preferably has a thickness in a range of between about 900 and 1100 Å and more preferably about 1000 Å. The Ti layer is preferably sputter deposited.

Next, a metal layer 48 preferably composed of Al/Cu/Si is sputtered at a temperature in a range of between about 490 and 520° C. and preferably a range of between about 495 and 515° C. most preferably about 505° C. on a semiconductor structure 10. The high sputter temperature is contributes to the high metal line stress. The high sputter temperature has the advantage of providing superior planarity.

The aluminum metal layer preferably has a composition of a Si wt % in a range of about 0.75 and 0.85 and a Cu wt % in a range of about 0.45 and 0.55% and more preferably about an 0.8 wt % Si—0.5 wt % Cu and 98.7% Al.

The aluminum alloy layer 32 is preferably deposited in a sputter by bombarding a metal ingot with plasma. Other metal deposition processes are also suitable. The metal target can be an ingot comprising about 0.5 to 2.5% Silicon and 0.45 to 0.55% Cu and the balance 99.999995% purity Al. The aluminum which is vaporized by the plasma is deposited on the semiconductor surface. The aluminum alloy layer can be sputter deposited from a single target containing Al, Cu, and silicon, at an energy of between about 5 and 13 kW, at a wafer temperature of between about 440 and 500° C., gas ambient of Argon and at a pressure of between about 1E-3 and 3E-3 torr, voltage range between about 480 and 650 V and a DC power supply. The Al metal is sputtered at a rate in a range of between about 11,400 and 12,600 Å/min (12,000 Å/min+/−5%) and more preferably about 12,000 Å/min. The sputter tool can be a model Endura 5500 made by Applied Materials, USA.

Next, a (ARC) TiN layer 50 is deposited over the metal layer 32. An anti-reflecting—coating (ARC) TiN layer 50 is formed over the metal lines. The anti-reflective properties improve lithography resolution by reducing reflectance off the layer. The ARC TiN layer can be formed by a sputtering process by reacting an excess of $N_2$ with Ti metal target. The layer 34 preferably has a reflectivity in a range between 0.5 and 0.6 and more preferably about 0.55.

In an important stage, a three stage heat treatment is performed on the metal layer 32 and the ARC TiN layer 50.

As shown in FIG. 3, the heat treatment comprises three steps. The heat treatment anneal for the metal two stage is the same as described above for the metal one stack.

After the heat treatment of the present invention, the metal layer and TiN layer are patterned using photo-etch processes. A metal photoresist layer having a pattern is formed over the metal stack 24 18 48 50. Next, the metal layer 28 48 50 is etched.

FIG. 6 shows the metal one stack 24 28 32 34 and the metal two stack 44 48 50 formed over a semiconductor substrate 10 including a source/drain region 12.

The elastic stress present in thin films (e.g., 48 and 50) is an inherent part of the deposition processes and can either be tensile or compressive. The magnitude and nature of the film's stress depends on the processing parameters, such as substrate temperature, deposition rate and method of deposition. Stresses of about 1E8 to 1E9 $N/m^2$ are commonly observed in thin films. These high stresses are capable of causing film fracture or delamination during deposition and/or at other post processing steps, such as at the etch steps where the film is subjected to harsh bombardment and high temperature. Because we have noticed the problem of peeling only occurs between the Al—Si—Cu 32 48 and overlying TiN Arc layer 34 50, the subsequent discussion of stress will focus on these two layers.

Stress in an aluminum metal layer with an overlying Anti-Reflection Coating (or any other deposited thin film in that manner) (e.g., TiN ARC) consists of two major components. First, a "thermal" component arises from the difference in the expansion coefficients of the TiN ARC layer 34 and of the Al metal layer 32. Second, an intrinsic (internal residual stress) component results from crystal growth and grain structure during (a) non-uniform cooling of the metal deposition film and (b) phase transformation that is induced upon cooling where phases have different densities.

The thermal component of stress is given by (Chopra 1969):

$$\sigma_{th} = Y_{barrier\ layer}(\alpha_{barrier\ layer} - \alpha_{metal\ layer})\Delta T \quad \text{Equation 3.3.1}$$

where $\sigma_{th}$=Thermal stress, $Y_{TiN\ ARC\ layer}$=Young's modulus for the $_{TiN\ ARC}$ layer, $\alpha_{TiN\ ARC\ layer}$ and $\alpha_{metal\ layer}$=coefficient of Thermal expansion of ARC TiN and Al, $\Delta T$=difference in temperature during the processing.

The intrinsic stress of the film is given by (Chopra 1969):

$$\sigma = Y_{metal} t_{metal}^2 / 6r t_{TiN\ ARC}(1-\mu) \quad \text{Equation 3.1.2}$$

where $\sigma$ is the intrinsic stress, $r=(L^2/2d)$, L=length of the film, d=deflection of the metal film, $Y_{metal}$=Young's modulus of Al metal film, $t_{metal}$ and $t_{TiN\ ARC}$ are the thicknesses of Al metal and TiN ARC layer, r is the curvature of the bent film; and $\mu$=Poisson's ratio.

If the stress in the TiN ARC layer is higher than the adhesion between the TiN ARC layer and the aluminum (Al) Metal layer, delamination and peeling of the top film will inevitably occur. If the stress in the TiN ARC film is higher than the fracture stress of the TiN ARC film but less than the TiN ARC to Metal layer (underlying film) adhesion, the TiN ARC film itself would fracture when exposed to a harsh environment, such as the etch.

Overall, Al metal layers having overlying ARC layer (e.g., TiN ARC) can experience non-compatibility in stress. This stress can cause the TiN ARC layer to peel from the Al Metal layer.

The delamination of the TiN Arc from the Al stack during etch is very likely to be related to the stress in both the films as explained above. The fact that why the phenomenon is occurring after metal etch can be correlated to the etch environment during the metal etch process. On the very fact that the metal deposition process (high temperature process) and composition of the metal target employed, the metal etch process has to be tuned to be in the high power and high bombardment range in order to attain a residue free surface after etch. The tradeoff to this process is the generation of high temperature and harsh environment during the etch. Referring to equation 3.1.1, since the temperature effect is considerable amplified during the process with the number of wafer etched and coupled with the thermal expansion difference on the thermal stress, the likelihood of warpage/distortion of the adhesion films is high.

Also, it appears that the voids are related to the thickness of the TiN ARC layer as explained by equation 3.1.2. The stress of the TiN ARC layer is dependent on the relative thickness of the Al and TiN Arc layer and with the Young's modulus of Al being a constant, it can be assumed that the TiN ARC internal stress may be hovering in the region of the fracture stress of the film.

The rough grain boundaries have been observed on X-SEM micrographs on the blemishes of the TiN ARC layer. These may be related to the selective intergranular corrosion that may have occurred after the metal etch process and during the insitu strip process. After the delamination of the TiN Arc, the underlying Al film is exposed the ambient environment and is susceptible to corrosive attack. Segregates of CuAl2 in the grain boundary region is normally cathodic in nature with respect to the bulk Al which anodic. Insitu stress process after metal etch employ a $H_2O$ plasma amount other gases and this may be the electrolyte to the localized minute galvanic cell in the grain boundaries regions.

The heat treatment anneal (i.e., stress relief anneal process) of the present invention reduces the stresses between the Al/SI/Cu metal layer and the ARC TiN layer and eliminates peeling problems. The three steps of the heat treatment correspond to three stress relieving stages: (a) recovery (ramp up), (b) recrystallization (temp. hold), (c) grain grown cycle (ramp down). The recovery stage (ramp up step) is designed to produce strain relieve effect through enhanced dislocation motion (without applied external stress). The second step of recrystallization produced equaixed grains which has much less internal strain energy. The driving force for the new grains formation is the difference in internal energy between the strain and unstrained equiaxed grains so formed. The third step (ramp down) is the normal grain growth cycle.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a defect free/reduced stress ARC TiN layer over a metal layer comprising:
    a) forming a metal layer composed of aluminum on a semiconductor structure; said metal layer is formed by sputtering metal composed of Al/Cu/Si at a temperature in a range of about 495° and 515° C.;
    b) depositing an ARC TiN layer over said metal layer; and
    c) performing a heat treatment of said metal layer and said ARC TiN layer comprising three steps: (1) a ramp up step, (2) a hold step, and (3) a ramp down step; in (2), said hold step, the temperature is held at a temperature in a range of between about 440° C. and 460° C., thereby reducing the stress between said ARC TiN layer and said sputtered metal layer which eliminates any peeling and blistering of the ARC TiN layer.

2. The method of claim 1 wherein said heat treatment further comprises: (1) the ramp up step where the temperature is increased from 25° C. to a temperature between about 440° C. to 460° C. at a rate in a range of about 40 and 50° C./min, (2) the hold step where the temperature is held at in a range of about 440° C. and 460° C. for a time in a range of about 30 and 40 seconds, and (3) the ramp down step where the temperature is ramped down a rate in a range of about 30 and 40° C./minute to 25° C.

3. The method of claim 1 wherein said metal layer has a composition of a Si wt % in a range of about 0.75 and 0.85 and a Cu wt % in a range of about 0.45 and 0.55.

4. The method of claim 1 wherein, before said metal layer is formed, forming a first insulating layer over semiconductor substrate, said first insulating layer composed of BPTEOS.

5. A method of fabricating a defect free/reduced stress ARC TiN layer over an aluminum layer comprising:
    a) forming a metal layer composed of Al/Cu/Si by sputtering at a temperature in a range of about 495° and 515° C. on a semiconductor structure;
    b) depositing an ARC TiN layer over said metal layer; and
    c) performing a three step heat treatment of said metal layer and said ARC TiN layer comprising (1) a ramp up step where the temperature is increased from room temperature to a temperature between about 440° C. to 460° C. at a rate in a range of about 40 and 50° C./min, (2) a hold step where the temperature is held at a temperature in a range of about 440° C. and 460° C. for a time in a range of about 30 to 40 seconds, and (3) a ramp down step where the temperature is ramped down at a rate in a range of about 30 to 40° C./min to room temperature, thereby reducing the stress between said ARC TiN layer and said sputtered metal layer which eliminates any peeling and blistering of the ARC TiN layer.

6. The method of claim 5 which, before said metal layer is formed, further includes
    a) forming a first insulating layer over semiconductor substrate, said first insulating layer composed of BPTEOS;
    b) forming a titanium layer over said first insulating layer;
    c) forming a TiN barrier layer over said titanium layer; said TiN barrier layer, titanium layer, said first insulating layer and said substrate comprising said semiconductor structure.

7. The method of claim 5 which, before said metal layer is formed, further includes
    a) forming a first insulating layer over semiconductor substrate, said first insulating layer composed of BPTEOS;
    b) forming a titanium layer over said first insulating layer; said titanium layer, said first insulating layer and said substrate comprising said semiconductor structure.

8. The method of claim 5 wherein said metal layer has a composition of a Si wt % in a range of about 0.75 and 0.85 and a Cu wt % in a range of about 0.45 and 0.55.

9. The method of claim 5 which, before said metal layer is formed, further includes
    a) forming a first insulating layer over semiconductor substrate, said first insulating layer composed of BPTEOS;

b) forming a titanium layer over said first insulating layer;

c) forming a TiN layer over said titanium layer, said TiN layer, titanium layer, said first insulating layer and said substrate comprising said semiconductor structure.

10. A method of fabricating a defect free/reduced stress ARC TiN layer over an aluminum layer comprising:

a) forming a metal layer composed of Al/Cu/Si on a semiconductor structure; said metal layer is deposited by a sputter by bombarding a metal target with plasma, said metal target can be an ingot comprising about 0.5 to 2.5% silicon and 0.45 to 0.55% copper and the balance 99.999995% purity aluminum, the sputtering is performed at an energy of between about 5 and 13 kW, at a wafer temperature of between about 440° and 500° C., in a gas ambient of argon and at a pressure of between about 1E-3 and 3E-3 torr, voltage range between about 480 V and 650 V, said metal layer is sputtered at a rate in a range of between about 11,400 and 12,600 Å/min;

b) depositing an ARC TiN layer over said metal layer; and c) performing a three step heat treatment of said metal layer and said ARC TiN layer comprising (1) a ramp up step where the temperature is increased from room temperature to a temperature between about 440° C. to 460° C. at a rate in a range of about 40 and 50° C./min, (2) a hold step where the temperature is held at a temperature in a range of about 440° C. and 460° C. for a time in a range of about 30 and 40 seconds, and (3) a ramp down step where the temperature is ramped down at a rate in a range of about 30 and 40° C./min to room temperature, thereby reducing the stress between said ARC TiN layer and said sputtered metal layer which eliminates any peeling and blistering of the ARC TiN layer.

* * * * *